(12) United States Patent
Lee

(10) Patent No.: US 12,040,647 B2
(45) Date of Patent: Jul. 16, 2024

(54) BATTERY MANAGEMENT SYSTEM, BATTERY PACK, ELECTRIC VEHICLE, AND BATTERY MANAGEMENT METHOD

(71) Applicant: LG ENERGY SOLUTION, LTD., Seoul (KR)

(72) Inventor: Bom-Jin Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 17/766,937

(22) PCT Filed: Dec. 11, 2020

(86) PCT No.: PCT/KR2020/018205
§ 371 (c)(1),
(2) Date: Apr. 6, 2022

(87) PCT Pub. No.: WO2021/118312
PCT Pub. Date: Jun. 17, 2021

(65) Prior Publication Data
US 2024/0079892 A1    Mar. 7, 2024

(30) Foreign Application Priority Data

Dec. 11, 2019  (KR) .......................... 10-2019-0164892

(51) Int. Cl.
*G01R 31/3835* (2019.01)
*H01M 10/42* (2006.01)
*H02J 7/00* (2006.01)

(52) U.S. Cl.
CPC ........ *H02J 7/0048* (2020.01); *G01R 31/3835* (2019.01); *H01M 10/425* (2013.01); *H02J 7/007* (2013.01); *H01M 2010/4271* (2013.01)

(58) Field of Classification Search
CPC ............. H02J 7/0048; G01R 31/3835; H01M 10/425; H01M 2010/4271
See application file for complete search history.

(56) References Cited

U.S. PATENT DOCUMENTS 6,531,875 B2    3/2003  Satake
10,254,346 B2   4/2019  Nishiguchi et al.
(Continued)

FOREIGN PATENT DOCUMENTS

JP  H11-289685 A    10/1999
JP  2002-234408 A    8/2002
(Continued)

OTHER PUBLICATIONS

Extended European Search Report dated Sep. 8, 2022 in corresponding European Patent Application No. 20900671.7.
(Continued)

*Primary Examiner* — Minh Q Phan
(74) *Attorney, Agent, or Firm* — Morgan, Lewis & Bockius LLP

(57) ABSTRACT

A battery management system includes a memory to store first and second Open Circuit Voltage (OCV) curves, a voltage sensor to measure a battery voltage across a battery, and a control circuit. The first OCV curve defines a first relationship between OCV and State Of Charge (SOC) of the battery during discharge of the battery. The second OCV curve defines a second relationship between OCV and SOC of the battery during charge of the battery. The control circuit is configured to interrupt a flow of current through the battery so that the battery is in a rest state when the control circuit receives a key-off signal. The control circuit estimates a SOC of the battery at a predetermined time interval based on the battery voltage measured at the predetermined
(Continued)

time interval and the first OCV curve in case that the battery is being discharged when the key-off signal is received.

14 Claims, 8 Drawing Sheets

(56) References Cited

U.S. PATENT DOCUMENTS

| | | |
|---|---|---|
| 10,436,850 B2 | 10/2019 | Hatano et al. |
| 2002/0113594 A1 | 8/2002 | Satake |
| 2006/0181245 A1 | 8/2006 | Mizuno |
| 2012/0290236 A1 | 11/2012 | Majima |
| 2015/0276885 A1* | 10/2015 | K.R. .................. G01R 31/367 702/63 |
| 2015/0355285 A1 | 12/2015 | Nishigaki et al. |
| 2017/0010327 A1 | 1/2017 | Nishiguchi et al. |
| 2017/0125853 A1 | 5/2017 | Song et al. |
| 2017/0199247 A1 | 7/2017 | Joe |
| 2017/0350943 A1 | 12/2017 | Tani et al. |
| 2018/0136283 A1 | 5/2018 | Song et al. |
| 2019/0137573 A1 | 5/2019 | Hatano et al. |
| 2019/0178948 A1 | 6/2019 | Takahashi |
| 2020/0011933 A1 | 1/2020 | Otagiri et al. |

FOREIGN PATENT DOCUMENTS

| | | |
|---|---|---|
| JP | 2002-365347 A | 12/2002 |
| JP | 2011-053088 A | 3/2011 |
| JP | 5823292 B2 | 11/2015 |
| JP | 6400182 B2 | 10/2018 |
| JP | 2018-169183 A | 11/2018 |
| JP | 2019-105520 A | 6/2019 |
| JP | 6555442 B2 | 8/2019 |
| KR | 10-2016-0049604 A | 5/2016 |
| KR | 10-2017-0051008 A | 5/2017 |
| KR | 10-1767635 B1 | 8/2017 |
| KR | 10-1792537 B1 | 11/2017 |
| KR | 10-2018-0116988 A | 10/2018 |
| WO | 2011/102179 A1 | 8/2011 |
| WO | 2015/129117 A1 | 9/2015 |
| WO | 2017/221899 A1 | 12/2017 |

OTHER PUBLICATIONS

International Search Report (with partial English translation) issued in corresponding International Patent Application No. PCT/KR2020/018205 dated Mar. 22, 2021.

* cited by examiner

| $\Delta t_{R1}$ [min] | | Reference SOC[%] | | | | | | | | | |
|---|---|---|---|---|---|---|---|---|---|---|---|
| | | 90 | 80 | 70 | 60 | 50 | 40 | 30 | 20 | 10 | 0 |
| Reference temperature [°C] | 25 | 1 | 2 | 3 | 5 | 7 | 8 | 11 | 15 | 20 | 23 |
| | 0 | 5 | 7 | 10 | 13 | 17 | 20 | 25 | 31 | 39 | 62 |

(a)

620

| $\Delta t_{C1}$ [min] | | Reference SOC[%] | | | | | | | | | |
|---|---|---|---|---|---|---|---|---|---|---|---|
| | | 90 | 80 | 70 | 60 | 50 | 40 | 30 | 20 | 10 | 0 |
| Reference temperature [°C] | 25 | 3 | 12 | 18 | 23 | 27 | 36 | 44 | 53 | 61 | 85 |
| | 0 | 15 | 60 | 83 | 91 | 103 | 110 | 135 | 157 | 175 | 425 |

| $\Delta t_{R2}$[min] | | Reference SOC[%] | | | | | | | | | |
|---|---|---|---|---|---|---|---|---|---|---|---|
| | | 10 | 20 | 30 | 40 | 50 | 60 | 70 | 80 | 90 | 100 |
| Reference temperature [°C] | 25 | 1 | 3 | 5 | 7 | 9 | 10 | 11 | 15 | 17 | 20 |
| | 0 | 4 | 7 | 11 | 13 | 22 | 25 | 36 | 41 | 51 | 68 |

(a)

820

| $\Delta t_{C2}$[min] | | Reference SOC[%] | | | | | | | | | |
|---|---|---|---|---|---|---|---|---|---|---|---|
| | | 10 | 20 | 30 | 40 | 50 | 60 | 70 | 80 | 90 | 100 |
| Reference temperature [°C] | 25 | 5 | 6 | 9 | 14 | 21 | 29 | 40 | 52 | 66 | 120 |
| | 0 | 20 | 25 | 30 | 47 | 50 | 60 | 71 | 96 | 193 | 580 |

(b)

BATTERY MANAGEMENT SYSTEM, BATTERY PACK, ELECTRIC VEHICLE, AND BATTERY MANAGEMENT METHOD

TECHNICAL FIELD

The present disclosure relates to technology that determines a state of charge of a battery.

The present application claims the benefit of Korean Patent Application No. 10-2019-0164892 filed on Dec. 11, 2019 with the Korean Intellectual Property Office, the disclosure of which is incorporated herein by reference in its entirety.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

A battery undergoes a cycle state and a rest state repeatedly. The cycle state refers to a state in which the charge/discharge of the battery is ongoing. The rest state refers to a state in which the charge/discharge of the battery is interrupted (stopped), i.e., a charge current and a discharge current do not flow through the battery.

Even in the rest state of the battery, the State Of Charge (SOC) of the battery may not be constantly maintained due to charge/discharge history in the cycle state, self-discharge of the battery and power consumption of a battery management system. Accordingly, it is necessary to monitor the SOC of the battery even in the rest state of the battery.

Meanwhile, conventionally, an Open Circuit Voltage (OCV) curve widely used to estimate the SOC of the battery is a dataset defining a relationship between OCV and SOC of the battery when hysteresis is completely removed with a lapse of a sufficiently long time after the charge/discharge of the battery was stopped.

However, in case that the rest state is not maintained for a sufficiently long time after the battery's shift from the cycle state to the rest state, it is impossible to sufficiently remove the hysteresis generated by the charge/discharge history in the cycle state.

Accordingly, SOC estimation based on only the OCV curve from the start time of the rest state (i.e., the ending time of the cycle state) without considering the period of time during which the battery is kept in the rest state results in low accuracy.

DISCLOSURE

Technical Problem

The present disclosure is designed to solve the above-described problem, and therefore the present disclosure is aimed at accurately determining a State Of Charge (SOC) of a battery while the battery is resting by changing an Open Circuit Voltage (OCV) curve defining a relationship between OCV and SOC, according to the period of time during which the battery is kept in the rest state after the battery's shift from the cycle state to the rest state.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

A battery management system according to an aspect of the present disclosure includes a memory configured to store a first Open Circuit Voltage (OCV) curve and a second OCV curve, a voltage sensor configured to measure a battery voltage which is a voltage across a battery, and a control circuit coupled to the memory and the voltage sensor. The first OCV curve defines a first relationship between OCV and State Of Charge (SOC) of the battery during discharge of the battery. The second OCV curve defines a second relationship between OCV and SOC of the battery during charge of the battery. The control circuit is configured to interrupt a flow of current through the battery so that the battery is in a rest state when the control circuit receives a key-off signal. The control circuit is configured to estimate a SOC of the battery at a predetermined time interval from a first time point to a second time point based on the battery voltage measured at the predetermined time interval and the first OCV curve in case that the battery is being discharged when the key-off signal is received. The first time point is a time point when a first standby time has passed since the key-off signal was received. The second time point is a time point when a first shift time has passed since the key-off signal was received, the first shift time being longer than the first standby time.

The control circuit may be configured to determine the first standby time and the first shift time based on a reference SOC and a reference temperature in case that the battery is being discharged when the key-off signal is received. The reference SOC indicates a SOC of the battery when the key-off signal is received. The reference temperature indicates a temperature of the battery when the key-off signal is received.

The memory may be further configured to store a third OCV curve defining a third relationship indicating an average of the first relationship and the second relationship. The control circuit may be configured to estimate the SOC of the battery at the predetermined time interval from the second time point based on the battery voltage measured at the predetermined time interval and the third OCV curve in case the battery is being discharged when the key-off signal is received.

The control circuit may be configured to estimate the SOC of the battery at the predetermined time interval from a third time point to a fourth time point based on the battery voltage measured at the predetermined time interval and the second OCV curve in case that the battery is being charged when the key-off signal is received. The third time point is a time point when a second standby time has passed since the key-off signal was received. The fourth time point is a time point when a second shift time has passed since the key-off signal was received, the second shift time being longer than the second standby time.

The control circuit may be configured to determine the second standby time and the second shift time based on a reference SOC and a reference temperature in case that the battery is being discharged when the key-off signal is received. The reference SOC indicates a SOC of the battery when the key-off signal is received. The reference temperature indicates a temperature of the battery when the key-off signal is received.

The memory may be further configured to store a third OCV curve defining a third relationship indicating an average of the first relationship and the second relationship. The control circuit may be configured to estimate the SOC of the battery at the predetermined time interval from the fourth time point based on the battery voltage measured at the predetermined time interval and the third OCV curve in case that the battery is being charged when the key-off signal is received.

A battery pack according to another aspect of the present disclosure includes the battery management system.

An electric vehicle according to still another aspect of the present disclosure includes the battery pack.

A battery management method according to further another aspect of the present disclosure is executable by the battery management system. The battery management method includes interrupting a flow of current through the battery so that the battery is in the rest state when receiving the key-off signal, and estimating the SOC of the battery at the predetermined time interval from the first time point to the second time point based on the battery voltage measured at the predetermined time interval and the first OCV curve in case that the battery is being discharged when the key-off signal is received.

The battery management method may further include estimating the SOC of the battery at the predetermined time interval from the third time point to the fourth time point based on the battery voltage measured at the predetermined time interval and the second OCV curve in case that the battery is being charged when the key-off signal is received. The third time point may be the time point when the second standby time has passed since the key-off signal was received. The fourth time point may be the time point when the second shift time has passed since the key-off signal was received, the second shift time being longer than the second standby time.

Advantageous Effects

According to at least one of the embodiments of the present disclosure, it is possible to accurately determine a State Of Charge (SOC) of a battery while the battery is resting by changing an Open Circuit Voltage (OCV) curve defining a relationship between OCV and SOC, according to the period of time during which the battery is kept in the rest state after the battery's shift from the cycle state to the rest state.

The effects of the present disclosure are not limited to the effects mentioned above, and these and other effects will be clearly understood by those skilled in the art from the appended claims.

BRIEF DESCRIPTION OF THE DRAWINGS

The accompanying drawings illustrate preferred embodiments of the present disclosure, and together with the detailed description of the present disclosure described below, serve to provide a further understanding of the technical aspects of the present disclosure, and thus the present disclosure should not be construed as being limited to the drawings.

FIG. 6 illustrates data tables for the method of FIG. 5.

FIG. 8 illustrates data tables for the method of FIG. 7.

DETAILED DESCRIPTION

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing unit of at least one function or operation, and may be implemented by hardware and software either alone or in combination.

In addition, throughout the specification, it will be further understood that when an element is referred to as being "connected to" another element, it can be directly connected to the other element or intervening elements may be present.

Figure 1:
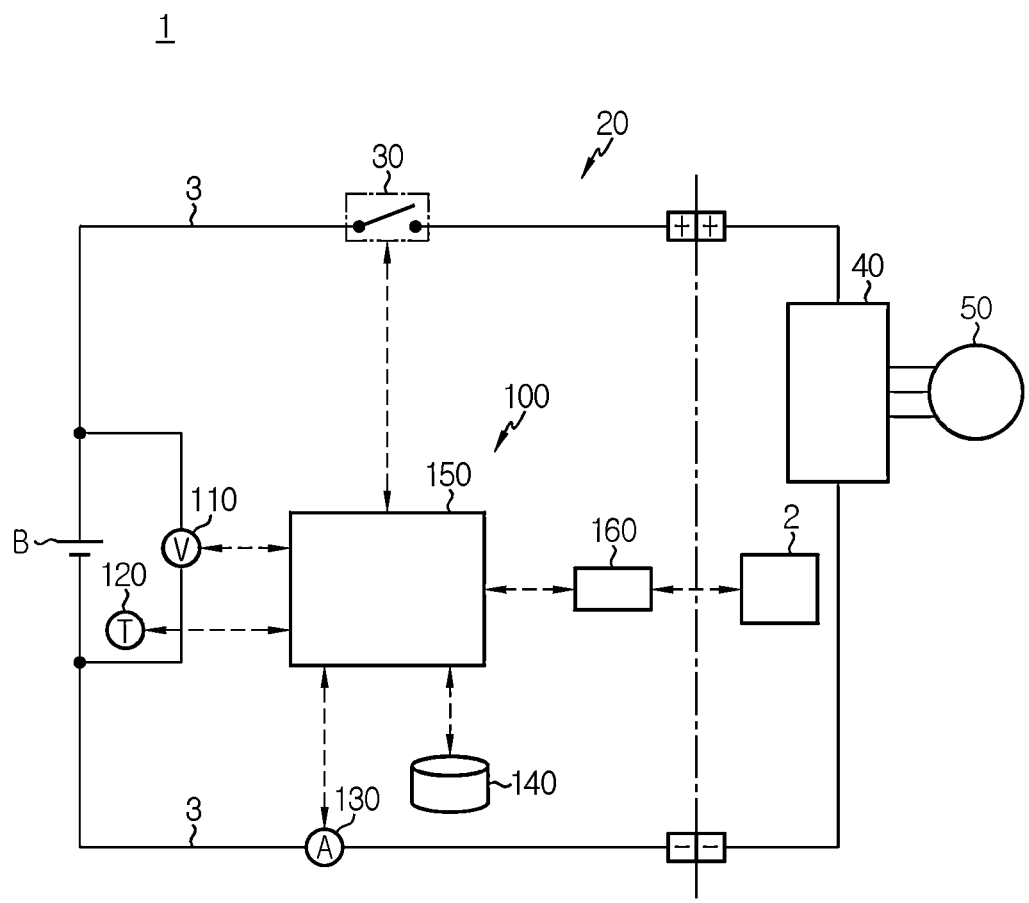
FIG. 1 is a diagram exemplarily showing a configuration of an electric vehicle according to the present disclosure.

FIG. 1 is a diagram exemplarily showing a configuration of an electric vehicle 1 according to the present disclosure.

Referring to FIG. 1, the electric vehicle 1 includes a vehicle controller 2, a battery pack 20, a switch 30, an inverter 40 and an electric motor 50.

The vehicle controller 2 is configured to generate a key-on signal in response to an engine start button (not shown) provided in the electric vehicle 1 being shifted to ON-position by a user. The vehicle controller 2 is configured to generate a key-off signal in response to the engine start button being shifted to OFF-position by the user.

The switch 30 is installed on a power line 3 for the battery pack 20. While the switch 30 is in an on state, power may be transferred from any one of the battery pack 20 and the inverter 40 to the other through the power line 3. The switch 30 may include any one of well-known switching devices such as a relay and a Field Effect Transistor (FET) or a combination thereof.

The inverter 40 converts the direct current power supplied from a battery B to alternating current power and supplies to the electric motor 50. The electric motor 50 converts the alternating current power from the inverter 40 to kinetic energy for the electric vehicle 1.

The battery pack 20 includes the battery B and a battery management system 100.

The battery B includes at least one battery cell. The battery cell is not limited to a particular type, and includes any type of rechargeable battery or cell, for example, a lithium ion cell.

The battery management system 100 includes a voltage sensor 110, a memory 140 and a control circuit 150. The battery management system 100 may further include at least one of a temperature sensor 120, a current sensor 130 or a communication circuit 160.

The voltage sensor 110 is provided to be electrically connectable to a positive electrode terminal and a negative electrode terminal of the battery B. The voltage sensor 110 is configured to measure a voltage across the battery B (hereinafter referred to as a 'battery voltage') at a predetermined time interval, and output a signal indicating the measured battery voltage to the control circuit 150.

The temperature sensor 120 is positioned within a predetermined distance from the battery B. For example, a thermocouple may be used as the temperature sensor 120. The temperature sensor 120 is configured to measure a temperature of the battery B (hereinafter referred to as 'battery temperature') at the predetermined time interval and output a signal indicating the measured battery temperature to the control circuit 150.

The current sensor 130 is installed on the power line 3. The current sensor 130 is provided to be electrically connectable to the battery B in series through the power line 3. For example, the current sensor 130 may include a shunt resistor or a hall effect device. The current sensor 130 is configured to measure an electric current flowing through the power line 3 (hereinafter referred to as a 'battery current') at the predetermined time interval, and output a signal indicating the measured battery current to the control circuit 150. The battery current measured during the discharge of the battery B may be referred to as a 'discharge current' and the battery current measured during the charge of the battery B may be referred to as a 'charge current'.

The memory 140 is configured to store programs and data necessary to perform battery management methods according to the embodiments as described below. The memory 140 may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM).

The control circuit 150 is operably coupled to the vehicle controller 2, the switch 30, the voltage sensor 110, the temperature sensor 120, the current sensor 130, the memory 140 and the communication circuit 160. The operably coupled refers to connection to enable unidirectional or bidirectional signal transmission and reception. The control circuit 150 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing other functions.

The communication circuit 160 may be coupled to the vehicle controller 2 of the electric vehicle 1 to enable communication between. The communication circuit 160 may transmit a message from the vehicle controller 2 to the control circuit 150, and transmit a message from the control circuit 150 to the vehicle controller 2. The communication between the communication circuit 160 and the vehicle controller 2 may use, for example, a wired network such as a local area network (LAN), a controller area network (CAN) and a daisy chain and/or a near-field wireless network such as Bluetooth, Zigbee, WiFi or the like.

The control circuit 150 may determine the SOC of the battery B based on the battery voltage, the battery current and/or the battery temperature. The determination of the SOC during the charge/discharge of the battery B may use well-known methods such as ampere counting, Kalman filter or the like. The determination of the SOC of the battery B while the battery B is resting will be described in detail below.

Figure 2:
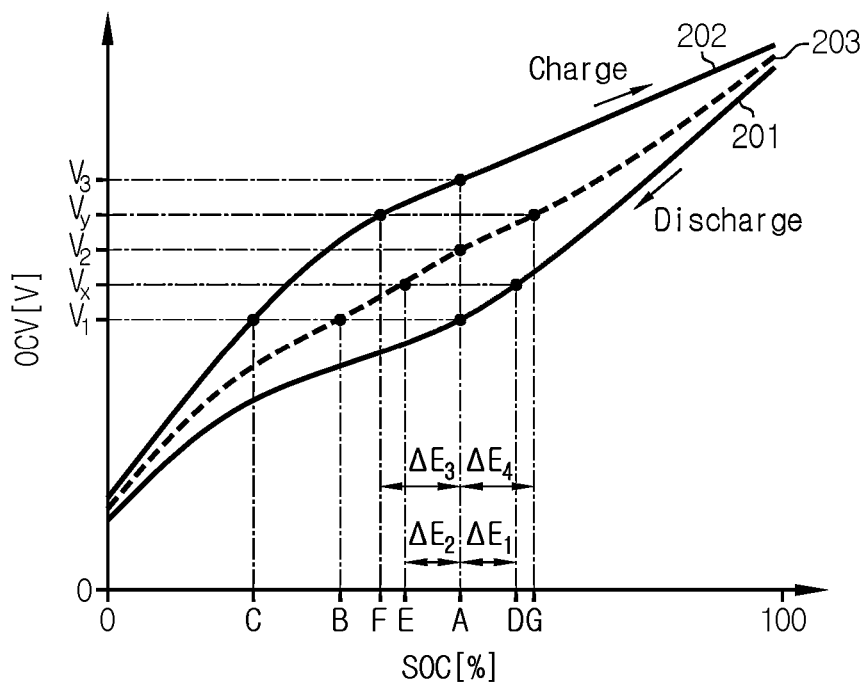
FIG. 2 is a diagram for describing hysteresis by charge/discharge history in a cycle state of a battery.

FIG. 2 is a diagram for describing hysteresis by charge/discharge history in the cycle state of the battery B.

Referring to FIG. 2, a curve 201 defines a first relationship between OCV and SOC of the battery B during the discharge of the battery B and may be referred to as a 'first OCV curve' or a 'discharge OCV curve'. The curve 201 may be data pre-acquired from a discharge testing process by repeating the constant current discharge and the rest in an alternating manner from full charge to full discharge of another battery (batteries) having the same specification as the battery B in an environment in which a predetermined reference temperature (for example, 25° C.) is maintained. For example, during the discharge test, the discharge using a predetermined current rate (for example, 0.1 C) over a first test time (for example, 60 min) and the rest over a second test time (for example, 5 min) may be repeated. In this case, the OCV of the curve 201 may indicate the battery voltage each time the battery B rests for the second test time during the discharge test.

A curve 202 defines a second relationship between OCV and SOC of the battery B during the charge of the battery B, and may be referred to as a 'second OCV curve' or a 'charge OCV curve'. The curve 202 may be data pre-acquired from the discharge testing process by repeating the constant current charge and the rest from full discharge to full charge of another battery (batteries) having the same specification as the battery B in an environment in which the predetermined reference temperature (for example, 25° C.) is maintained. For example, during the charge test, the charge using the predetermined current rate (for example, 0.1 C) over a third test time (for example, 60 min) and the rest over a fourth test time (for example, 5 min) may be repeated. In this case, the OCV of the curve 202 may indicate the battery voltage each time the battery B rests for the fourth test time during the charge test.

A curve 203 defines a third relationship indicating an average of the first relationship and the second relationship and may be referred to as a 'third OCV curve' or an 'average OCV curve'. By averaging the first relationship and the second relationship, the hysteresis induced by discharge and the hysteresis induced by charge cancel each other out. Accordingly, the third relationship may indicate the OCV and SOC of the battery B when the hysteresis of the battery B is completely removed.

At the same SOC, the OCV of the curve 201 is lower than the OCV of the curve 203 due to the hysteresis generated by the discharge, while the OCV of the curve 202 is higher than the OCV of the curve 203 due to the hysteresis generated by the charge. For example, where SOC=A [%], OCV $V_1$ of the curve 201 is lower than OCV $V_2$ of the curve 203, and OCV $V_3$ of the curve 202 is higher than OCV $V_2$ of the curve 203. For reference, since the curve 203 is an average of the curve 201 and the curve 202, $V_2=(V_1+V_3)/2$.

By the same reason, at the same OCV, the SOC of the curve 201 is higher than the SOC of the curve 203, while the SOC of the curve 202 is lower than the SOC of the curve 203. For example, where OCV=$V_1$ [V], SOC A [%] of the curve 201 is higher than SOC B [%] of the curve 203, and SOC C [%] of the curve 202 is lower than SOC B [%] of the curve 203.

Figure 3:
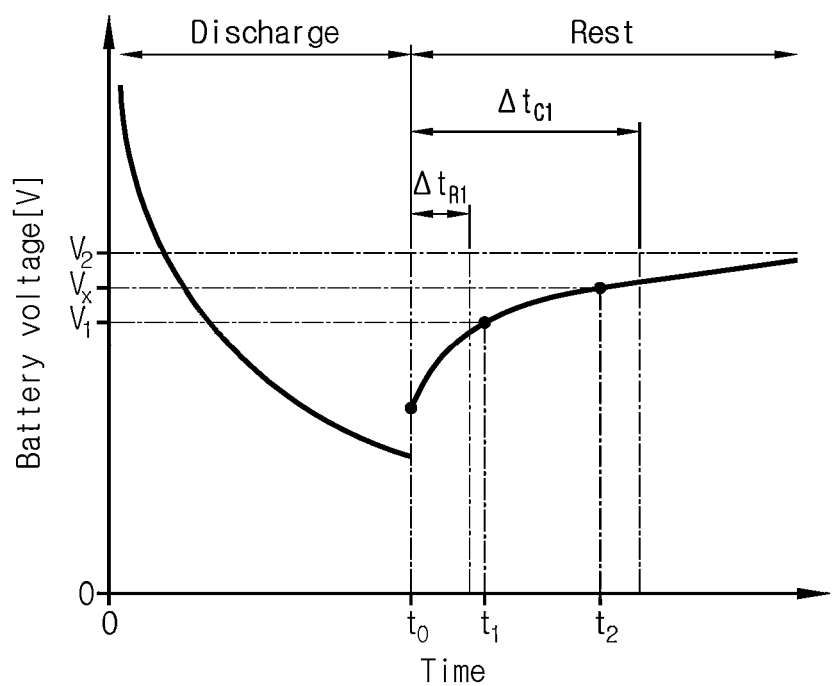
FIG. 3 is a diagram for describing a phenomenon in which hysteresis generated by the discharge of a battery is reduced in a rest state.

FIG. 3 is a diagram for describing a phenomenon in which the hysteresis generated by the discharge of the battery B is reduced in the rest state.

Referring to FIG. 3, in response to a key-off signal received during the discharge of the battery B, the battery B enters the rest state from a time point $T_0$. For convenience of description, assume that the actual SOC of the battery B at the time point $T_0$ is A [%].

Referring to FIGS. 2 and 3, as the hysteresis by the discharge is resolved from the time point $T_0$, the battery voltage gradually rises. At a time point $T_1$, the battery voltage reaches OCV $V_1$ of the curve 201. The time point $T_1$ may be a time point when a predetermined time has passed since the time point $T_0$. With a lapse of a sufficient time from the time point $T_0$, the battery voltage reaches OCV $V_2$ of the curve 203.

At a time point $T_2$ after the time point $T_1$, the battery voltage $V_x$ is between $V_1$ and $V_2$. When a reference is made to the curve 201, the SOC at the time point $T_2$ is determined as D [%]. In contrast, when a reference is made to the curve 203, the SOC at the time point $T_2$ is determined as E [%].

While the battery B is resting, $V_x$ gradually rises to $V_2$, and thus a difference between $V_x$ and $V_1$ increases, while a difference between $V_x$ and $V_2$ decreases, as can be seen from FIGS. 2 and 3. Additionally, while the battery B is resting, a difference $\Delta E_1$ between A and D increases, while a difference $\Delta E_2$ between A and E decreases.

When $\Delta E_1$ is smaller than $\Delta E_2$, the SOC determined based on the curve 201 is closer to the actual SOC than the SOC determined based on the curve 203. In contrast, when $\Delta E_1$ is larger than $\Delta E_2$, the SOC determined based on the curve 203 is closer to the actual SOC than the SOC determined based on the curve 201.

In view of this, the control circuit 150 may be configured to determine a first shift time $\Delta t_{C1}$ as an estimated time required until $\Delta E_1$ equals $\Delta E_2$. The control circuit 150 may determine the SOC at a predetermined time interval based on the curve 201 from a time point when a first standby time $\Delta t_{R1}$ has passed since the time point $T_0$, and determine the SOC at the predetermined time interval based on the curve 203 from a time point when the first shift time $\Delta t_{C1}$ has passed since the time point $T_0$.

Figure 4:
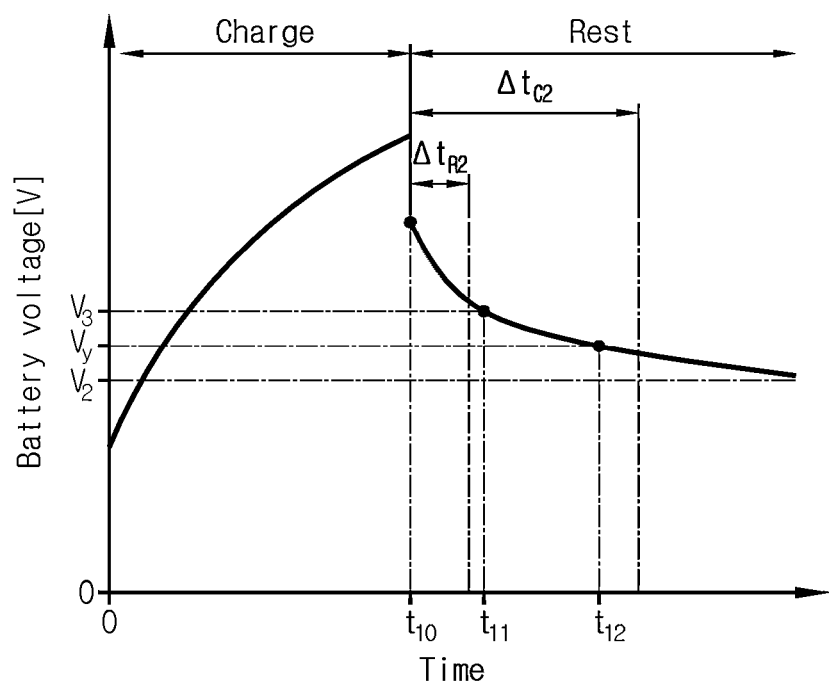
FIG. 4 is a diagram for describing a phenomenon in which hysteresis generated by the charge of a battery is reduced in a rest state.

FIG. 4 is a diagram for describing a phenomenon in which the hysteresis generated by the charge of the battery B is reduced in the rest state.

Referring to FIG. 4, in response to a key-off signal received during the charge of the battery B, the battery B goes into the rest state from a time point $T_{10}$. For convenience of description, assume that the actual SOC of the battery B at the time point $T_{10}$ is A [%].

Referring to FIGS. 2 and 4, as the hysteresis by the charge is resolved after the time point $T_{10}$, the battery voltage gradually drops. At a time point $T_{11}$, the battery voltage reaches OCV $V_3$ of the curve 202. The time point $T_{11}$ may be a time point when a predetermined time has passed since the time point $T_{10}$. With a lapse of a sufficient time from the time point $T_{10}$, the battery voltage reaches OCV $V_2$ of the curve 203.

At a time point $T_{12}$ after the time point $T_{11}$, the battery voltage $V_y$ is between $V_3$ and $V_2$. When a reference is made to the curve 202, the SOC at the time point $T_{12}$ is determined as F [%]. In contrast, when a reference is made to the curve 203, the SOC at the time point $T_{12}$ is determined as G [%].

While the battery B is resting, $V_y$ gradually drops to $V_2$, and thus a difference between $V_y$ and $V_3$ increases, while a difference between $V_y$ and $V_2$ decreases, as can be seen from FIGS. 2 and 4. Additionally, while the battery B is resting, a difference $\Delta E_3$ between A and F increases, while a difference $\Delta E_4$ between A and G decreases.

When $\Delta E_3$ is smaller than $\Delta E_4$, the SOC determined based on the curve 202 is closer to the actual SOC than the SOC determined based on the curve 203. In contrast, when $\Delta E_3$ is larger than $\Delta E_4$, the SOC determined based on the curve 203 is closer to the actual SOC than the SOC determined based on the curve 202.

In view of this, the control circuit 150 may be configured to determine a second shift time $\Delta t_{C2}$ as an estimated time required until $\Delta E_3$ equals $\Delta E_4$. The control circuit 150 may determine the SOC at the predetermined time interval based on the curve 202 from a time point when a standby time $\Delta t_{R2}$ has passed since the time point $T_{10}$, and may determine the SOC at the predetermined time interval based on the curve 203 from a time point when the second shift time $\Delta t_{C2}$ has passed since the time point $T_{10}$.

Figure 5:
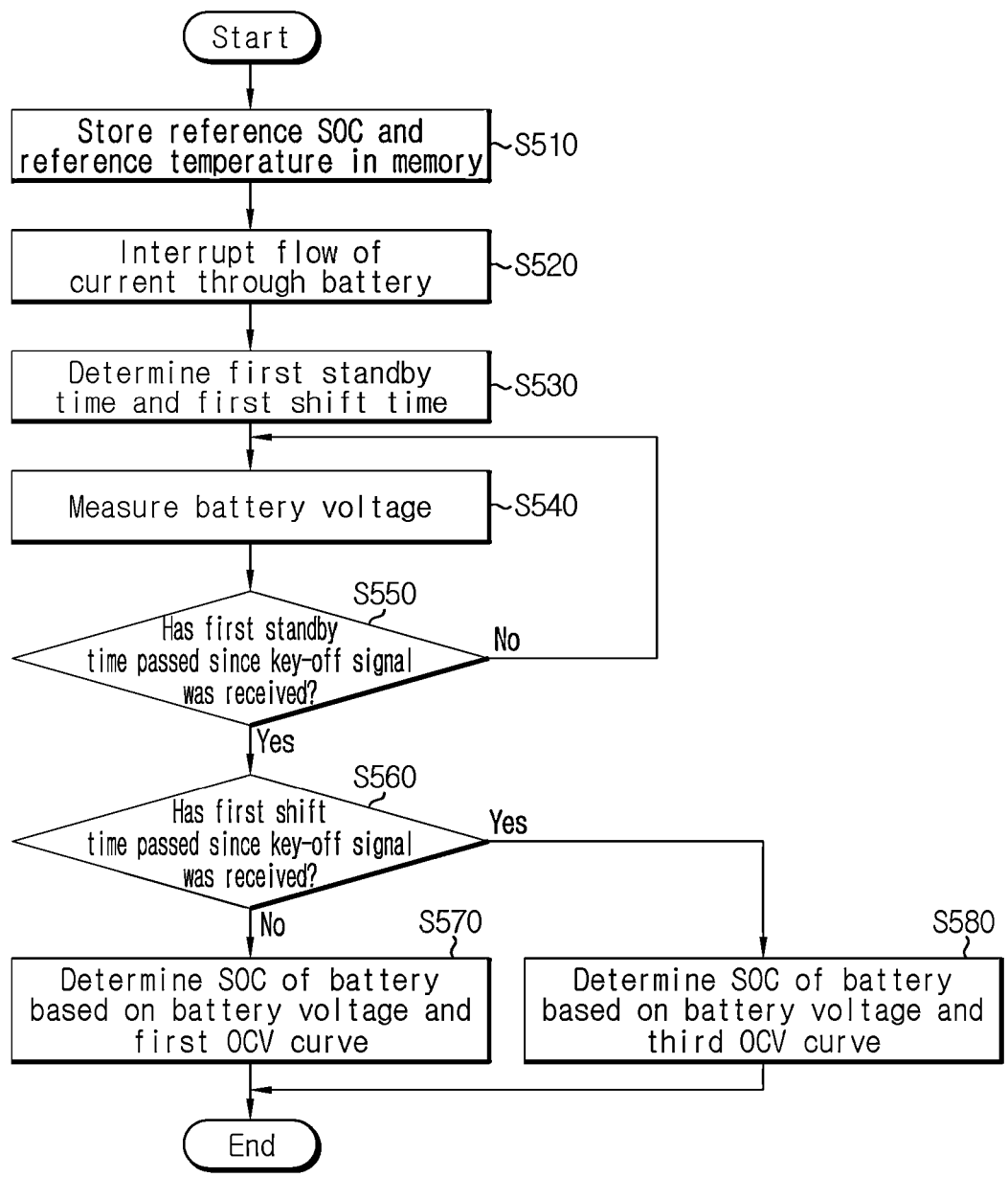
FIG. 5 is a flowchart illustrating a battery management method according to a first embodiment of the present disclosure.

FIG. 5 is a flowchart illustrating a battery management method according to a first embodiment of the present disclosure, and FIG. 6 illustrates data tables for the method of FIG. 5. The method of FIG. 5 may start by a key-off signal from the vehicle controller 2 during the discharge of the battery B.

Referring to FIGS. 1 to 3, 5 and 6, in step S510, the control circuit 150 stores a reference SOC and a reference temperature in the memory 140. The reference SOC indicates the SOC of the battery B when the key-off signal is received. The reference temperature indicates the battery temperature when the key-off signal is received.

In step S520, the control circuit 150 interrupts a flow of current through the battery B.

That, the control circuit 150 turns off the switch 30. Thus, the battery B is shifted from the cycle state to the rest state.

In step S530, the control circuit 150 determines the first standby time $\Delta t_{R1}$ and the first shift time $\Delta t_{C1}$ based on the reference SOC and the reference temperature.

The first standby time $\Delta t_{R1}$ is a length of time required since the key-off signal was received to determine the SOC of the battery B using the curve 201. At the early stage of the rest state, the battery voltage rises fast, so it is undesirable to determine the SOC of the battery B using the curve 201 from the start of the rest state. For example, the first standby time $\Delta t_{R1}$ is an estimated time required until the rate at which the battery voltage rises equals a predetermined threshold rate (for example, 0.01 V/minute) from the start time of the rest state.

The first shift time $\Delta t_{C1}$ is longer than the first standby time $\Delta t_{R1}$. The first shift time $\Delta t_{C1}$ is a length of time required since the key-off signal was received to determine the SOC of the battery B using the curve 203 instead of the curve 201.

Referring to FIG. 6, a data table 610 and a data table 620 are stored in the memory 140. The data table 610 defines a relationship between the reference SOC, the reference temperature and the first standby time $\Delta t_{R1}$. The data table 610 defines that the lower reference temperature is associated with the longer first standby time $\Delta t_{R1}$ at the same reference SOC. For example, when the reference SOC is 90 [%] and the reference temperature is 25[° C.], 1 minute is determined as the first standby time $\Delta t_{R1}$, and when the reference SOC is 90 [%] and the reference temperature is 0[° C.], 5 minutes is determined the first standby time $\Delta t_{R1}$. Additionally, the data table 610 defines the lower reference SOC is associated with the longer or equal first standby time $\Delta t_{R1}$ at the same reference temperature. For example, when the reference SOC is 80 [%] and the reference temperature is 25[° C.], 2 minutes is determined as the first standby time $\Delta t_{R1}$, and when the reference SOC is 70 [%] and the reference temperature is 25[° C.], 3 minutes is determined as the first standby time $\Delta t_{R1}$.

The data table 620 defines a relationship between the reference SOC, the reference temperature and the first shift time $\Delta t_{C1}$. The data table 620 defines that the lower reference temperature is associated with the longer first shift time $\Delta t_{C1}$ at the same reference SOC. Additionally, the data table 620 defines that the lower reference SOC is associated with the longer or equal first shift time $\Delta t_{C1}$ at the same reference temperature.

The numeric values in the data table 610 and the data table 620 are provided by way of example to help understanding.

Alternatively, each of the first standby time $\Delta t_{R1}$ and the first shift time $\Delta t_{C1}$ may be preset to a particular value irrespective of the SOC and the temperature. In this case, the steps S510 and S530 may be omitted from the method of FIG. 5.

In step S540, the control circuit 150 measures the battery voltage.

In step S550, the control circuit 150 determines whether the first standby time $\Delta t_{R1}$ has passed since the key-off signal was received. When a value of the step S550 is "Yes", step S560 is performed.

In the step S560, the control circuit 150 determines whether the first shift time $\Delta t_{C1}$ has passed since the key-off signal was received. When a value of the step S560 is "No", step S570 is performed. When the value of the step S560 is "Yes", step S580 is performed.

In the step S570, the control circuit 150 determines the SOC of the battery B based on the battery voltage and the first OCV curve 201.

In the step S580, the control circuit 150 determines the SOC of the battery B based on the battery voltage and the third OCV curve 203.

The control circuit 150 may determine the SOC of the battery B at the predetermined time interval by repeating the steps S540 to S580 until a key-on signal is received from the vehicle controller 2.

Figure 7:
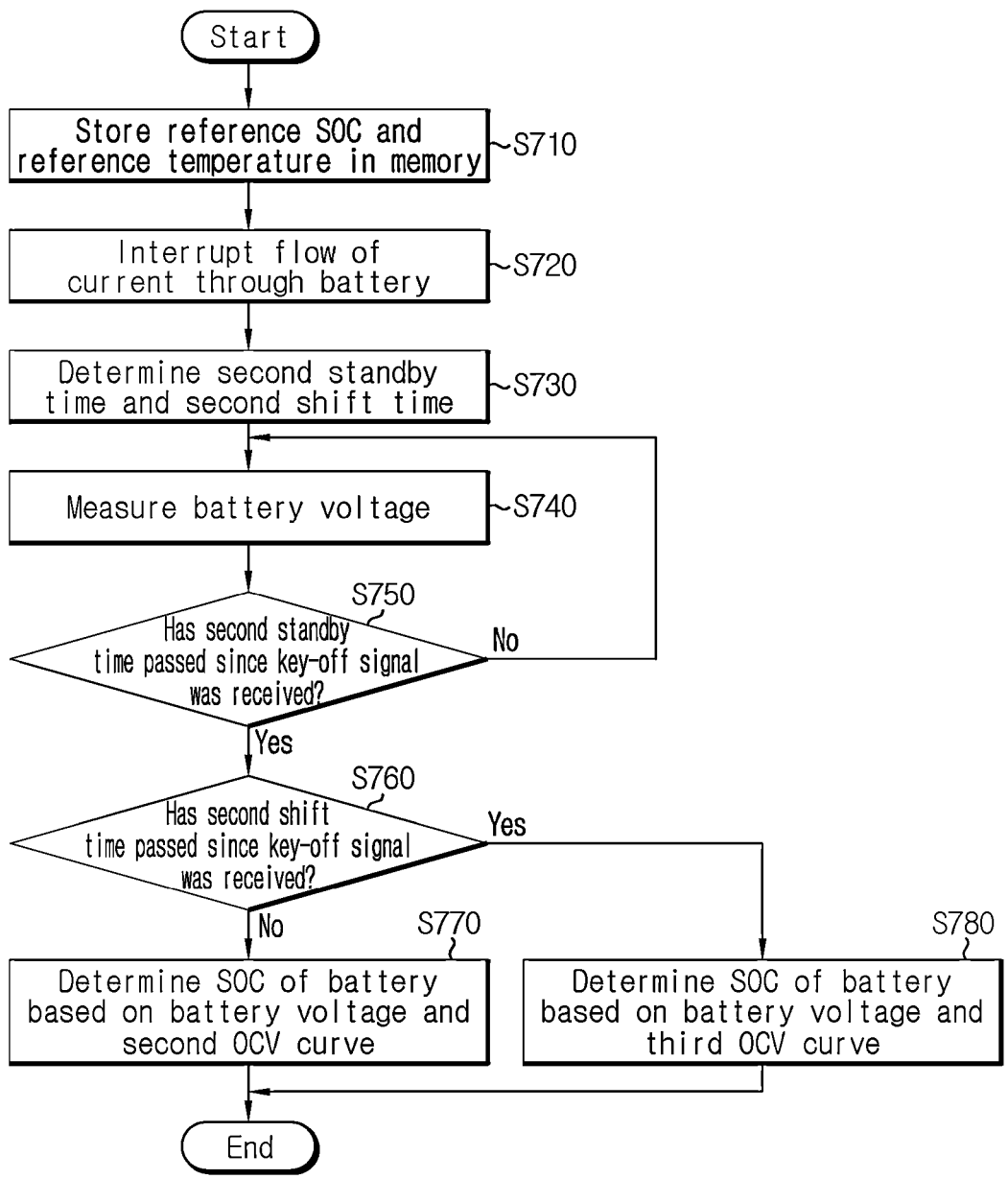
FIG. 7 is a flowchart illustrating a battery management method according to a second embodiment of the present disclosure.

FIG. 7 is a flowchart illustrating a battery management method according to a second embodiment of the present disclosure, and FIG. 8 illustrates data tables for the method of FIG. 7. The method of FIG. 7 may start by a key-off signal from the vehicle controller 2 during the charge of the battery B.

Referring to FIGS. 1, 2, 4, 7 and 8, in step S710, the control circuit 150 stores the reference SOC and the reference temperature in the memory 140. The reference SOC indicates the SOC of the battery B when the key-off signal is received. The reference temperature indicates the battery temperature when the key-off signal is received.

In step S720, the control circuit 150 interrupts a flow of current through the battery B. That is, the control circuit 150 turns off the switch 30. Thus, the battery B is shifted from the cycle state to the rest state.

In step S730, the control circuit 150 determines the second standby time $\Delta t_{R2}$ and the second shift time $\Delta t_{C2}$ based on the reference SOC and the reference temperature.

The second standby time $\Delta t_{R2}$ is a length of time required since the key-off signal was received to determine the SOC of the battery B using the curve 202. At the early stage of the rest state, the battery voltage drops fast, so it is undesirable to determine the SOC of the battery B using the curve 202 from the start of the rest state. For example, the second standby time $\Delta t_{R2}$ is an estimated time required until the rate at which the battery voltage drops equals a predetermined threshold rate (for example, 0.01 V/minute) from the start time of the rest state.

The second shift time $\Delta t_{C2}$ is a length of time required since the key-off signal was received to determine the SOC of the battery B using the curve 203 instead of the curve 202.

Referring to FIG. 8, a data table 810 and a data table 820 are stored in the memory 140. The data table 810 defines a relationship between the reference SOC, the reference temperature and the second standby time $\Delta t_{R2}$. The data table 810 defines that the lower reference temperature is associated with the longer second standby time $\Delta t_{R2}$ at the same reference SOC. For example, when the reference SOC is 80 [%] and the reference temperature is 25[° C.], 15 minutes is determined as the second standby time $\Delta t_{R2}$, and when the reference SOC is 80 [%] and the reference temperature is 0[° C.], 41 minutes is determined as the second standby time $\Delta t_{R2}$. Additionally, the data table 810 defines that the higher reference SOC is associated with the longer or equal second standby time at the same reference temperature. For example, when the reference SOC is 20 [%] and the reference temperature is 25[° C.], 3 minutes is determined as the second standby time, and when the reference SOC is 30 [%] and the reference temperature is 25[° C.], 7 minutes is determined as the second standby time.

The data table 820 defines a relationship between the reference SOC, the reference temperature and the second shift time $\Delta t_{C2}$. The data table 820 defines that the lower reference temperature is associated with the longer second shift time $\Delta t_{C2}$ at the same reference SOC. Additionally, the data table 820 defines that the higher reference SOC is associated with the longer or equal second shift time $\Delta t_{C2}$ at the same reference temperature.

The numeric values in the data table 810 and the data table 820 are provided by way of example to help understanding.

Alternatively, each of the second standby time $\Delta t_{R2}$ and the second shift time $\Delta t_{C2}$ may be preset to a particular value irrespective of the SOC and the temperature. In this case, the steps S710 and S730 may be omitted from the method of FIG. 5.

In step S740, the control circuit 150 measures the battery voltage.

In step S750, the control circuit 150 determines whether the second standby time $\Delta t_{R2}$ has passed since the key-off signal was received. When a value of the step S750 is "Yes", step S760 is performed.

In the step S760, the control circuit 150 determines whether the second shift time $\Delta t_{C2}$ has passed since the key-off signal was received. When a value of the step S760 is "No", step S770 is performed. When the value of the step S760 is "Yes", step S780 is performed.

In the step S770, the control circuit 150 determines the SOC of the battery B based on the battery voltage and the second OCV curve 202.

In the step S780, the control circuit 150 determines the SOC of the battery B based on the battery voltage and the third OCV curve 203.

The control circuit 150 may determine the SOC of the battery B at the predetermined time interval by repeating the steps S740 to S780 until a key-on signal is received from the vehicle controller 2.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A battery management system, comprising:
   a memory configured to store a first Open Circuit Voltage (OCV) curve and a second OCV curve;
   a voltage sensor configured to measure a battery voltage which is a voltage across a battery; and
   a control circuit coupled to the memory and the voltage sensor,
   wherein the first OCV curve defines a first relationship between OCV and State Of Charge (SOC) of the battery during discharging of the battery,
   wherein the second OCV curve defines a second relationship between OCV and SOC of the battery during charging of the battery,
   wherein the control circuit is configured to:
     receive a key-off signal and, in response to the key-off signal, interrupt a flow of current through the battery so that the battery is in a rest state, and
     estimate a SOC of the battery at a first predetermined time interval from a first time point to a second time point based on the battery voltage measured at the first predetermined time interval and the first OCV curve if the key-off signal is received during discharging of the battery,
   wherein the first time point is a time point when a first standby time passes after the key-off signal is received during discharging of the battery, and
   wherein the second time point is a time point when a first shift time passes after the key-off signal is received during discharging of the battery, the first shift time being longer than the first standby time.

2. The battery management system according to claim 1, wherein the control circuit is further configured to determine the first standby time and the first shift time based on a reference SOC and a reference temperature if the key-off signal is received during discharging of the battery,
   wherein the reference SOC indicates a SOC of the battery when the key-off signal is received, and
   wherein the reference temperature indicates a temperature of the battery when the key-off signal is received.

3. The battery management system according to claim 1, wherein the memory is further configured to store a third OCV curve defining a third relationship indicating an average of the first relationship and the second relationship, and
   wherein the control circuit is further configured to estimate the SOC of the battery at a second predetermined time interval from the second time point based on the battery voltage measured at the second predetermined time interval and the third OCV curve if the key-off signal is received during discharging of the battery.

4. The battery management system according to claim 1, wherein the control circuit is further configured to estimate the SOC of the battery at a second predetermined time interval from a third time point to a fourth time point based on the battery voltage measured at the second predetermined time interval and the second OCV curve if the key-off signal is received during charging of the battery,
   wherein the third time point is a time point when a second standby time passes after the key-off signal is received during charging of the battery, and
   wherein the fourth time point is a time point when a second shift time passes after the key-off signal is received during charging of the battery, the second shift time being longer than the second standby time.

5. The battery management system according to claim 4, wherein the control circuit is further configured to determine the second standby time and the second shift time based on a reference SOC and a reference temperature if the key-off signal is received during charging of the battery,
   wherein the reference SOC indicates a SOC of the battery when the key-off signal is received, and
   wherein the reference temperature indicates a temperature of the battery when the key-off signal is received.

6. The battery management system according to claim 4, wherein the memory is further configured to store a third OCV curve defining a third relationship indicating an average of the first relationship and the second relationship, and
   wherein the control circuit is further configured to estimate the SOC of the battery at a third predetermined time interval from the fourth time point based on the battery voltage measured at the third predetermined time interval and the third OCV curve if the key-off signal is received during charging of the battery.

7. A battery pack comprising the battery management system according to claim 1.

8. An electric vehicle comprising the battery pack according to claim 7.

9. A battery management method that is executable by the battery management system according to claim 1, the battery management method comprising:
   receiving the key-off signal;
   in response to the key-off signal, interrupting a flow of current through the battery so that the battery is in the rest state; and
   estimating the State Of Charge (SOC) of the battery at the first predetermined time interval from the first time point to the second time point based on the battery voltage measured at the first predetermined time interval and the first Open Circuit Voltage (OCV) curve if the key-off signal is received during discharging of the battery.

10. The battery management method according to claim 9, further comprising:
   estimating the SOC of the battery at a second predetermined time interval from a third time point to a fourth time point based on the battery voltage measured at the second predetermined time interval and the second OCV curve if the key-off signal is received during charging of the battery,
   wherein the third time point is a time point when a second standby time passes after the key-off signal is received during charging of the battery, and
   wherein the fourth time point is a time point when a second shift time passes after the key-off signal is received during charging of the battery, the second shift time being longer than the second standby time.

11. The battery management method of claim 10, further comprising:
   determining the second standby time and the second shift time based on a reference SOC and a reference temperature if the key-off signal is received during charging of the battery,
   wherein the reference SOC indicates a SOC of the battery when the key-off signal is received, and
   wherein the reference temperature indicates a temperature of the battery when the key-off signal is received.

12. The battery management method of claim 10, further comprising:
   estimating the SOC of the battery at a third predetermined time interval from the fourth time point based on the battery voltage measured at the third predetermined time interval and a third OCV curve if the key-off signal is received during charging of the battery,
   wherein the memory is further configured to store the third OCV curve defining a third relationship indicating an average of the first relationship and the second relationship.

13. The battery management method of claim 9, further comprising:
   determining the first standby time and the first shift time based on a reference SOC and a reference temperature if the key-off signal is received during discharging of the battery,
   wherein the reference SOC indicates a SOC of the battery when the key-off signal is received, and
   wherein the reference temperature indicates a temperature of the battery when the key-off signal is received.

14. The battery management method of claim 9, further comprising:
   estimating the SOC of the battery at a second predetermined time interval from the second time point based on the battery voltage measured at the second predetermined time interval and a third OCV curve if the key-off signal is received during discharging of the battery,
   wherein the memory is further configured to store the third OCV curve defining a third relationship indicating an average of the first relationship and the second relationship.

* * * * *